(12) United States Patent
Zhou et al.

(10) Patent No.: US 9,041,569 B2
(45) Date of Patent: May 26, 2015

(54) METHOD AND APPARATUS FOR CALIBRATION OF SUCCESSIVE APPROXIMATION REGISTER ANALOG-TO-DIGITAL CONVERTERS

(71) Applicants: Yan Zhou, Austin, TX (US); Clayton Daigle, Austin, TX (US); Shouli Yan, Austin, TX (US); Mohamed Elsayed, Austin, TX (US)

(72) Inventors: Yan Zhou, Austin, TX (US); Clayton Daigle, Austin, TX (US); Shouli Yan, Austin, TX (US); Mohamed Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 13/931,767

(22) Filed: Jun. 28, 2013

(65) Prior Publication Data

US 2015/0002321 A1    Jan. 1, 2015

(51) Int. Cl.
*H03M 1/06*    (2006.01)

(52) U.S. Cl.
CPC .................... *H03M 1/0617* (2013.01)

(58) Field of Classification Search
CPC ....... H03M 1/0009; H03M 1/38; H03M 1/10; H03M 3/38; H03M 3/414; H03M 2201/63; H03M 2201/64; H03M 2201/65
USPC .......... 341/155, 144, 161, 172, 163, 118, 120
See application file for complete search history.

(56) References Cited

U.S. PATENT DOCUMENTS

| 4,709,225 A | 11/1987 | Welland et al. |
| 4,908,621 A * | 3/1990 | Polonio et al. ................. 341/120 |

(Continued)

FOREIGN PATENT DOCUMENTS

EP    1473836 B1    3/2004

OTHER PUBLICATIONS

Liu, Wenbo, "Low-Power High-Performance SAR ADC Design with Digital Calibration Techniques," Dissertation, pp. 1-151, Submitted in partial fulfillment of the requirements for the degree of Doctor of Philosophy in Electrical and Computer Engineering in the Graduate College of the University of Illinois at Urbana-Champaign, 2010.

(Continued)

*Primary Examiner* — Peguy Jean Pierre
(74) *Attorney, Agent, or Firm* — Cesari & Reed LLP; R. Michael Reed

(57) ABSTRACT

A successive approximation register (SAR) ADC includes an SAR comparator circuit including first and second inputs, a control input, and first and second outputs. The SAR comparator circuit further includes a plurality of capacitors coupled to the first and second inputs and includes a plurality of switches configured to couple the plurality of capacitors to one of a first voltage and a second voltage. The SAR ADC further includes a calibration circuit coupled to the first and second outputs and to the control input of the SAR comparator. The calibration circuit is configured to control the plurality of switches to selectively couple the plurality of capacitors to one of the first and second voltages to provide a calibration signal to the SAR comparator circuit. The calibration circuit is configured to calibrate the SAR comparator based on corresponding output signals at the first and second outputs.

19 Claims, 7 Drawing Sheets

(56) References Cited

U.S. PATENT DOCUMENTS

| | | | |
|---|---|---|---|
| 5,668,549 A | 9/1997 | Opris et al. | |
| 6,674,386 B2* | 1/2004 | Carreau et al. | 341/155 |
| 7,095,346 B2* | 8/2006 | Bogner | 341/120 |
| 7,501,965 B2* | 3/2009 | Janakiraman | 341/118 |
| 7,986,181 B2* | 7/2011 | Confalonieri et al. | 327/553 |
| 8,482,449 B1* | 7/2013 | Zabroda | 341/172 |
| 2009/0267817 A1* | 10/2009 | Schatzberger | 341/138 |
| 2012/0025062 A1 | 2/2012 | Neubauer et al. | |
| 2012/0212359 A1 | 8/2012 | Lai et al. | |
| 2012/0306671 A1 | 12/2012 | Kapusta et al. | |
| 2013/0162454 A1* | 6/2013 | Lin | 341/120 |
| 2014/0097975 A1* | 4/2014 | Hong et al. | 341/110 |

OTHER PUBLICATIONS

McNeill, John A.; Coln, Michael C.; Brown, D. Richard; and Larivee, Brian J.; "Digital Background-Calibration Algorithm for 'Split ADC' Architecture," IEEE Transactions on Circuits and systems, Feb. 2009, pp. 294-306, vol. 56, No. 2.

Kwong, Raymond H.; and Johnston, Edward; "A Variable Step Size LMS Algorithm," pp. 1633-1642, IEEE Transactions on Signal Processing, Vo. 40, No. 7, Jul. 1992.

Banister, Brian C.; and Zeidler, James R.; "A Simple Gradient Sign Algorithm for Transmit Antenna Weight Adaptation with Feedback"; UC San Diego Previously Published Papers, UC San Diego, May 1, 2003, previously published in IEEE Transactions on Signal Processing, Vo. 51, No. 5, May 2003; pp. 1156-1171.

* cited by examiner

METHOD AND APPARATUS FOR CALIBRATION OF SUCCESSIVE APPROXIMATION REGISTER ANALOG-TO-DIGITAL CONVERTERS

FIELD

The present disclosure is generally related to calibration of analog-to-digital converters. More specifically, the present disclosure relates to an integrated calibration circuit configured to selectively control a switch configuration to selectively charge capacitors of the analog-to-digital converter to provide a calibration signal.

BACKGROUND

Analog-to-digital converters (ADCs) convert analog signals into digital signals by sampling the analog signal onto capacitors and quantizing the samples. In an example, an N-bit quantizer provides $2^N-1$ decision levels over its full scale range, where each decision level corresponds to one distinct digital output code. The sampled analog signal is quantized to determine a digital code that is closest to the analog sample. The difference between digital code and the analog sample represents a quantization error.

SUMMARY

In an embodiment, a successive approximation register (SAR) ADC includes an SAR comparator circuit including first and second inputs, a control input, and first and second outputs. The SAR comparator circuit further includes a plurality of capacitors coupled to the first and second inputs and includes a plurality of switches configured to couple the plurality of capacitors to one of a first voltage and a second voltage. The SAR ADC further includes a calibration circuit coupled to the first and second outputs and to the control input of the SAR comparator. The calibration circuit is configured to control the plurality of switches to selectively couple the plurality of capacitors to one of the first and second voltages to provide a calibration signal to the SAR comparator circuit. The calibration circuit is configured to calibrate the SAR comparator based on corresponding output signals at the first and second outputs.

In another embodiment, a calibration circuit includes at least one input coupled to at least one output of an ADC and at least one control output coupled to a control input of the ADC. The calibration circuit further includes a signal generator configured to provide a control signal to the at least one control output to control a plurality of switches to selectively couple a plurality of capacitors of the ADC to one of a first voltage and a second voltage to produce a calibration signal. The calibration circuit also includes a capacitor value update unit coupled to the at least one output of the ADC and configured to determine capacitor values of capacitors of the ADC in response to the calibration signal.

In still another embodiment, a method of calibrating an ADC includes providing a calibration signal to inputs of the ADC by controlling a plurality of switches to selectively couple a plurality of capacitors to one of a first voltage and a second voltage. The plurality of capacitors is coupled to the inputs of the ADC. The method further includes determining a sign of an error of an output signal from the ADC and updating a capacitor value of a selected capacitor of a plurality of capacitors of the ADC by selectively adding or subtracting a step size from a previous capacitor value of the selected capacitor based on the sign of the error.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

Embodiments of a calibration circuit and methods of calibrating an SAR ADC are described below that utilize a self-generated, sign-based, adaptive process to calibrate the SAR ADC to a selected level of precision. In an example, the calibration process can be performed on power up, periodically, in response to a control signal, or any combination thereof. In an embodiment, a calibration circuit controls a plurality of switches to selectively charge one or more capacitors coupled to an input of a comparator to provide an input calibration signal. Further, the calibration circuit may control the plurality of switches to alter the charge provided to the one or more capacitors over time to produce the calibration signal having a number of digital steps. The configuration of the switches may be varied over time to alter the amplitude of the input signal providing a time-varying input signal that may be used to calibrate the ADC. In an embodiment, the calibration circuits and methods employ a sign-based least mean square (LMS) algorithm to calibrate the SAR ADC. In an example, the SAR ADC may be calibrated to 16-bit precision within 150 ms. Further, the sign-based least mean square (LMS) convergence speed may be enhanced by selectively adapting the step size. Further, a pseudo-random noise generator may be used to inject a small amount of noise into the input signal to enhance the adaptive convergence.

In a SAR ADC, bit weights are determined based on capacitor ratios. In a radix-2 implementation, the capacitors may be binary weighted, which binary weighting leads to a readily determined digital value when the capacitors are matched. However, fabrication imprecision can result in capacitor mismatches, introducing ambiguity in the digital values. Unfortunately, in a Radix-2 implementation, a high precision ADC SAR may have insufficient information to resolve such ambiguities. One possible example of an SAR ADC that uses a Radix less than two according to an embodiment is described below with respect to FIG. 1.

Figure 1:
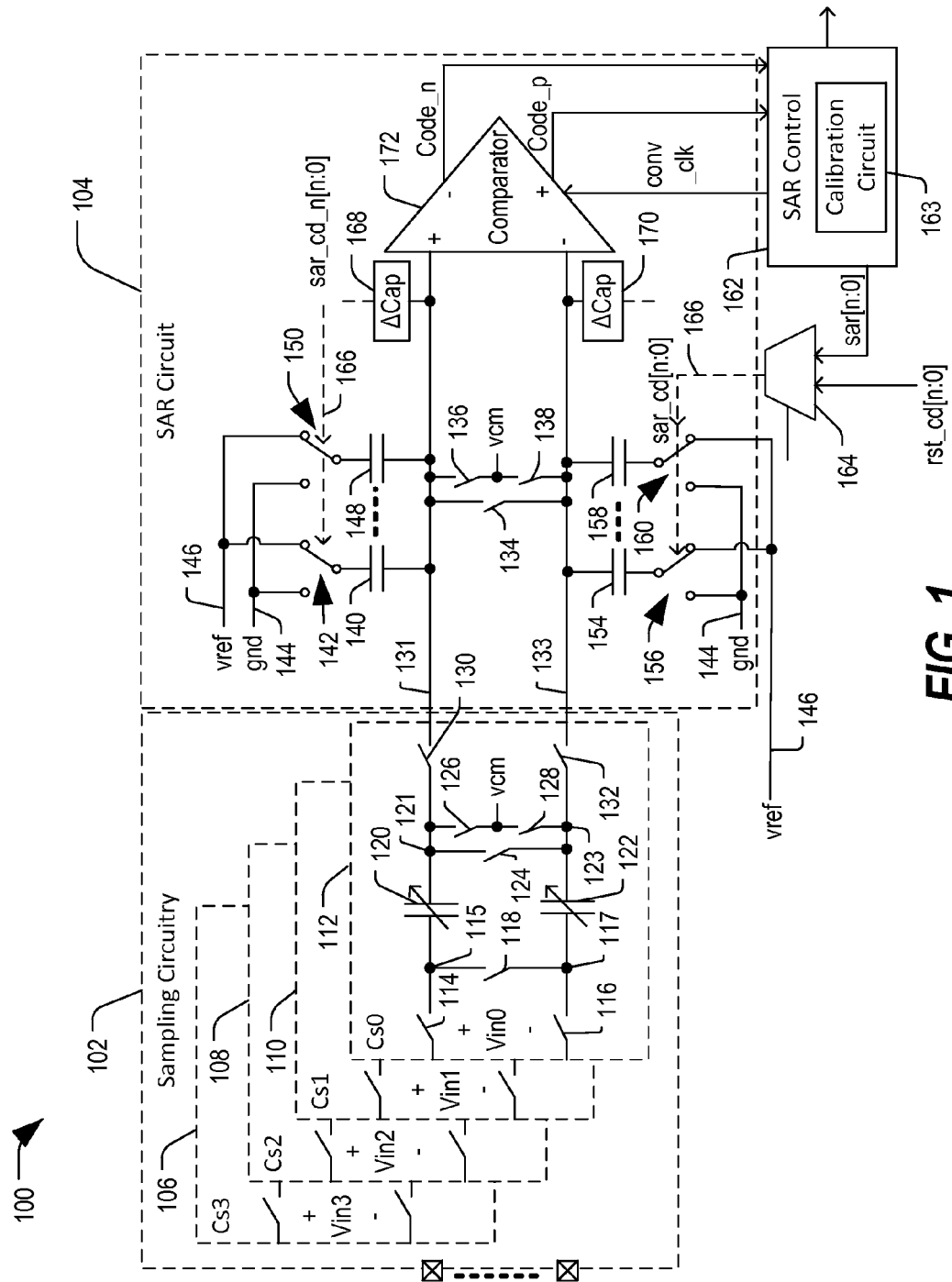
FIG. 1 is a diagram of an embodiment of an SAR ADC configured to perform a sign-based adaptive calibration according to an embodiment.

FIG. 1 is a diagram of an embodiment of an SAR ADC 100 according to an embodiment. SAR ADC 100 includes sampling circuitry 102 and SAR circuit 104. Sampling circuitry 102 includes multiple capacitive sampling circuits 106, 108, 110, and 112 (labeled "$C_{S0}$", "$C_{S1}$", "$C_{S2}$", and "$C_{S3}$"). While the illustrated embodiment depicts four capacitive sampling circuits 106, 108, 110, and 112, sampling circuitry 102 may include any number of capacitive sampling circuits. Each of the multiple sampling circuits 106, 108, 110, and 112 may be coupled to a signal source (such as a conductive trace or circuit) configured to provide a signal.

Capacitive sampling circuit 112 includes a switch 114 coupled between a pin or pad and a node 115. Capacitive sampling circuit 112 further includes a switch 116 coupled between a pin or pad and a node 117. Capacitive sampling circuit 112 includes a switch 118 coupled between node 115 and node 117. Capacitive sampling circuit 112 further includes a capacitor 120 coupled between node 115 and a node 121. Capacitive sampling circuit 112 further includes a capacitor 122 coupled between node 117 and a node 123. Capacitive sampling circuit 112 includes a switch 124 coupled between node 121 and node 123. Further, capacitive sampling circuit 112 includes a switch 126 coupled between node 121 and a bias node (labeled "$V_{CM}$"), which may be configured to provide a sample common mode signal. Capacitive sampling circuit 112 further includes a switch 128 coupled between the bias node ($V_{CM}$) and node 123. Capacitive sampling circuit 112 further includes a conversion switch 130 coupled between node 121 and a node 131, and includes a conversion switch 132 coupled between node 123 and node 133. Capacitive sampling circuits 106, 108, and 110 have similar switches and capacitors to provide the same functionality as capacitive sampling circuit 112 for a different set of inputs.

SAR circuit 104 further includes a switch 134 coupled between node 131 and node 133. When switch 134 is closed, switch 134 shorts the inputs of comparator 172. SAR circuit 104 further includes a switch 136 coupled between node 131 and a bias node (labeled "$V_{CM}$"), which is configured to provide a common mode voltage that can be used to reset the capacitors. SAR circuit 104 also includes a switch 138 coupled between node 133 and the bias node.

SAR circuit 104 further includes a capacitor 140 coupled between node 131 and a tri-state switch 142, which is also coupled to a node 144 (labeled "GND") and to a reference node 146 (labeled "$V_{REF}$"). In an alternative embodiment, node 144 may be a power supply node configured to provide a reference signal, such as a second reference voltage. In an embodiment, nodes 144 and 146 provide first and second reference voltages. In another embodiment, node 144 may provide a negative reference voltage, and reference node 146 may provide a positive reference voltage, relative to ground.

SAR circuit 104 further includes a capacitor 148 coupled between node 131 and a switch 150, which is also coupled to node 144 and to reference node 146. While two capacitors 140 and 148 are shown, SAR circuit 104 may include any number of capacitors.

SAR circuit 104 includes a capacitor 154 coupled between node 133 and a switch 156, which is also coupled to node 144 and to reference node 146. SAR circuit 104 also includes a capacitor 158 coupled between node 133 and a switch 160, which is also coupled to node 144, and to reference node 146. While two capacitors 154 and 158 are shown, SAR circuit 104 may include any number of capacitors.

SAR circuit 104 includes a comparator 172 having a positive input coupled to node 131 and a negative input coupled to node 133. Comparator 172 further includes a positive output to provide a positive digital code (Code_P) and a negative digital code (Code_N), which positive and negative outputs are coupled to a SAR control circuit 162, which includes an output coupled to an input of a multiplexer 164 to provide an SAR signal labeled "sar[n:0]". Multiplexer 164 includes a second input configured to receive a reset code (labeled "rst_cd[n:0]"), a control input to receive a select signal, and an output 166 configured to provide a switch control signal (labeled "sar_cd[n:0]" to switches 156 and 160. Additionally, SAR control circuit 162 provides an inverted version of the SAR switch control signal (labeled "sar_cd_n[n:0]") to switches 142 and 150. SAR control circuit 162 further includes an output configured to provide a conversion clock signal (labeled "CONV_CLK") to comparator 172. SAR control circuit 162 further includes a calibration circuit 163, which is configured to control a calibration operation involving capacitors 140, 148, 154, and 158. Further, calibration circuit 163 may selectively bias capacitors (labeled "ΔCap") 168 and 170 during a calibration operation. Capacitors 168 and 170 may be referred to as "delta capacitors", which may be used to inject noise, such as pseudo-random noise, onto the inputs of comparator 172 by coupling capacitors 168 and 170 to a selected voltage.

Conventionally, prior to sampling an input signal and using the SAR circuit 104, a calibration signal would be injected into the SAR circuit 104, using (for example) an external signal generator. Such external signal generators introduce noise into the calibration.

In the illustrated embodiment, during a calibration operation, switches 130 and 132 are open to disconnect sampling circuitry 102 from SAR circuit 104. Calibration circuit 163 controls switches 142, 150, 156 and 160 to selectively couple capacitors 140, 148, 154, and 158 to supply terminals 144 and 146 to apply charge to the capacitors 140, 148, 154, and 158 and to dump the applied charge onto nodes 131 and 133. Further, calibration circuit 163 may control switches associated with capacitors 168 and 170 to selectively charge the capacitors 168 and 170 and to dump the associated charge onto nodes 131 and 133. The differential voltage across nodes 131 and 133 is provided to comparator 172, which determines digital codes corresponding to the differential voltage, and provides the digital codes to SAR control circuit 162. The calibration circuit 163 varies the control signal over a period of time during the calibration operation to vary the switch configuration, producing a time-varying calibration signal at the inputs (nodes 131 and 133) of comparator 172 that may be used to calibrate the SAR ADC. As discussed below, calibration circuit 163 includes a signal generator, which produces a control signal that controls the switches 142, 150, 156, and 160 to provide an internally generated calibration signal (ramp signal) to the SAR circuit 104 and to calibrate the plurality of capacitors 140, 148, 154, and 158 relative to capacitors 168 and 170. Further, calibration circuit 163 may control bias capacitors 168 and 170 to inject noise into the calibration signal.

In an embodiment, the node points ("taps") between adjacent capacitors represent bits to be evaluated, and the charge or voltage at the selected taps of the capacitor network of SAR circuit 104 corresponds to the bit being determined. The error of the system can be determined according to the following equation:

$$\text{error} = Q(\text{Input}+\Delta) - Q(\text{Input}-\Delta) - 2Q(\Delta), \quad (1)$$

where Q represents the quantization process performed by the quantizer, and the ($\pm\Delta$) represents capacitors 168 and 170 coupled to positive and negative inputs of comparator 172. The error relates to the output of the quantizer as follows:

$$\text{error} = \text{Code}(\text{Input}+\Delta) \cdot W - \text{Code}(\text{Input}-\Delta) \cdot W - 2 \cdot \Delta_d, \quad (2)$$

where the code represents the result of the quantization, the variable W represents the capacitor weight, and the variable ($\Delta_d$) represents the capacitors 168 and 170. Conventionally, the capacitor weight (W) at a given tap (k) at a given time (n) can be determined according to the following equation:

$$W_k(n+1) = W_k(n) - \mu_k \cdot \text{error}(n) \cdot (\text{Code}_k(n+1) - \text{Code}_k(n)), \quad (3)$$

where the value ($W_k$) refers to the capacitor weight at a given tap position, and the value ($\mu_k$) represents a step size. However, the factor "error(n)" may represent a 23-bit value, and the step size ($\mu_k$) may also include multiple bits. Such multiplication of multi-bit values to determine the capacitor weight is relatively math intensive, adding cost and circuit area to a calibration circuit.

Calibration circuit 163 simplifies the mathematics used to calibrate the capacitors by relying on the sign of the comparison and by utilizing the digital codes from the output of comparator 172 as described below. An embodiment of a calibration circuit 163 to determine the capacitor values is described below with respect to FIG. 2.

Figure 2:
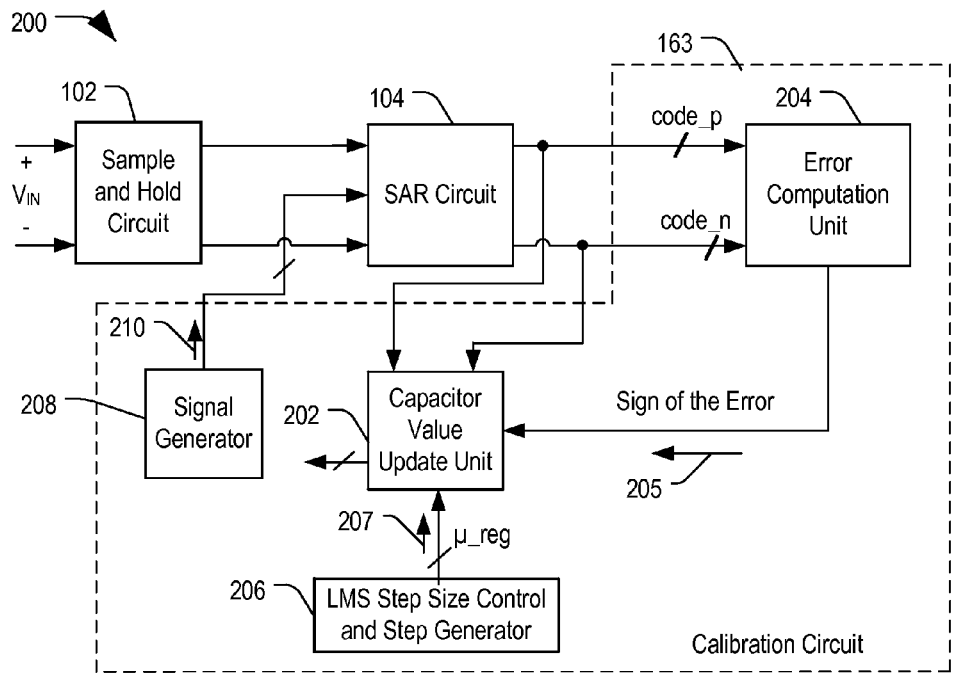
FIG. 2 is a block diagram of a SAR ADC including a calibration circuit to provide sign-based adaptive calibration.

FIG. 2 is a block diagram of a SAR ADC 200 including a calibration circuit 163 to provide sign-based adaptive calibration. SAR ADC 200 includes a sample and hold circuit 102 including inputs to receive a differential input signal (such as an input voltage $V_{IN}$) and outputs coupled to inputs of SAR circuit 104, which has outputs coupled to calibration circuit 163.

Calibration circuit 163 includes a capacitor value update unit 202 including inputs coupled to the outputs of SAR circuit 104, an input coupled to an output of an error computation unit 204, an input coupled to an output of a least mean square (LMS) step size control and step generator circuit 206, and an output to provide the capacitor value update. In some embodiments, the output may be coupled to a register to store the capacitor values.

Error computation unit 204 includes two inputs to receive the outputs of SAR circuit 104. Error computation unit 204 determines a sign of the error 205 based on the outputs of SAR circuit 104, and provides the sign of the error 205 to the input of capacitor value update unit 202. The sign of the error 205 may be a minus one (−1) value when error computation unit 204 determines a sign of the error 205 that is less than zero, and may be a plus one (+1) value when the error computation unit 204 determines a sign of the error 205 that is greater than or equal to zero.

LMS step size control and step generator 206 is configured to control a step size of the LMS capacitor value calculations performed by capacitor value update unit 202. In particular, LMS step size control and step generator 206 is configured to adjust the step sizes of the update equations by providing a step size signal 207 to capacitor value update unit 202. The step size adjustment is selectively updated over time.

Figure 5:
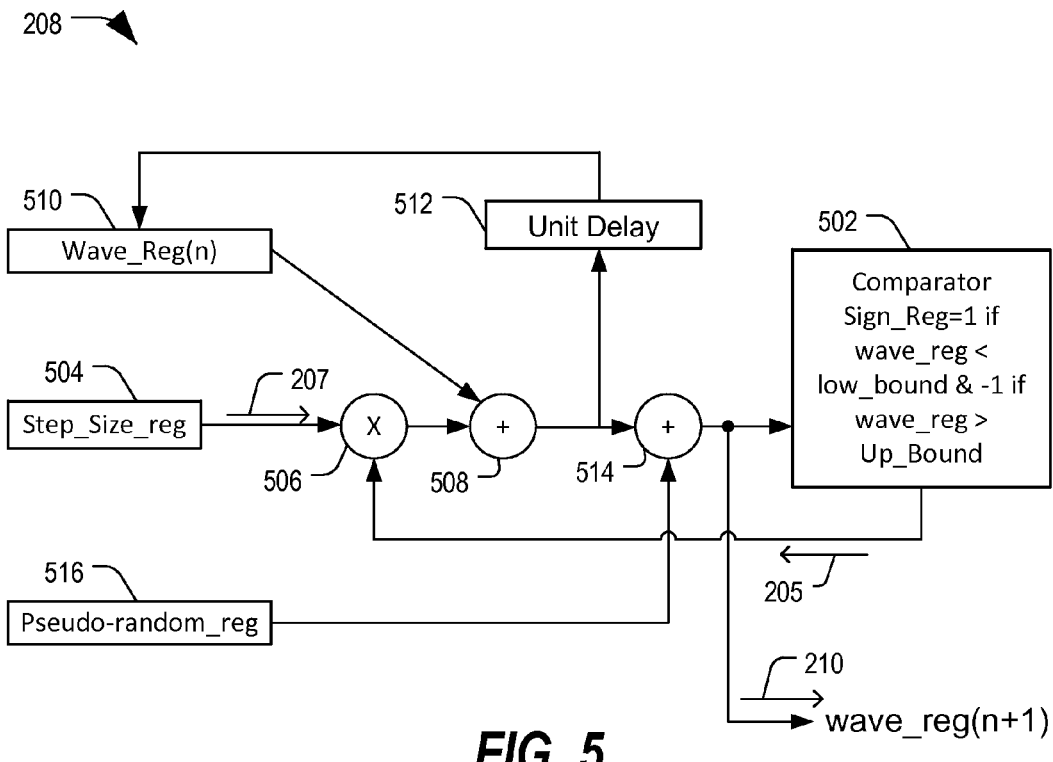
FIG. 5 is a block diagram of a signal generator of the calibration circuit of FIG. 1 configured to produce the waveform of FIG. 4.

Calibration circuit 163 further includes a signal generator 208 configured to provide a capacitor control signal 210 to selectively control the switches of SAR circuit 104 during a calibration phase. In an example, the capacitor control signal 210 may itself be a periodic signal, such as a ramp signal that increases to an upper bound (as illustrated in FIG. 5). Alternatively, capacitor control signal 210 may control switches of SAR circuit 104 to selectively activate switches to produce a ramp signal by selectively applying voltages to selected capacitors. Further, a pseudo-random perturbation may be convolved with, superimposed on, or injected into the input of comparator 172 as a ramp signal to assist in convergence. In an example, the pseudo-random perturbation signal may be injected via the capacitors 168 and 170 (in FIG. 1) by selectively coupling the capacitors 168 and 170 to a selected voltage. The capacitor control signal 210 represents a digital code that alters the configuration of the switches of SAR circuit 104 during the convolution phase to provide a calibration signal to comparator 172.

In an embodiment, sample and hold circuit 102 is disconnected from SAR circuit 104. Signal generator 208 provides capacitor control signal 210 to switches of SAR circuit 104, charging the capacitors and dumping charge onto the input nodes 131 and 133 of SAR circuit 104. Comparator 172 captures the differential voltage and provides the differential voltage to SAR circuit 104, which produces a digital approximation of the sampled value, which are provided as positive code (labeled "Code_P") and negative code (labeled "Code_N") to calibration circuit 163. The digital approximation is processed by error computation unit 204 to determine a sign of the error 205, which is provided to capacitor value update unit 202. Capacitor value update unit 202 also receives the digital approximation from SAR circuit 104 and receives a step size adjustment signal from LMS step size control and step generator 206. In response to the sign of the error 205, the digital approximation, and the step size adjustment signals, capacitor value update unit 202 can determine the calibrated digital output for the SAR ADC 200 for a given input signal. In particular, over a brief period of time, calibration circuit 163 forces the error to zero in a least-mean-square sense. In steady state, the variation of the plus and minus is cancelled through averaging to yield the digital output corresponding to the input voltage ($V_{IN}$).

SAR ADC 200 uses a radix that is less than two. In general, this means that the capacitor values within the SAR circuit 104 have relative values that differ exponentially as a function of the radix (i.e., Radix$^N$). So, assuming a radix of 1.86, the first capacitor may have a capacitance of $1.86^0$ pf (1 pf); the next capacitor may have a value of $1.86^1$ pf (i.e., 1.86 pf); the next capacitor may have a value of $1.86^2$ pf (i.e., 3.46 pf), and so on. By utilizing such a radix value, redundancy is built into the SAR circuit 104, making it possible to resolve ambiguities to provide the digital output.

It should be understood that bit weights in SAR ADCs are determined by capacitor ratios in the conversion process. In the presence of mismatches, digital calibration can be performed to determine the correct bit weights and to remove the conversion errors. In SAR ADC 200, the sub-radix-2 architecture ensures that the DAC mismatch errors are correctable. In particular, the bit weights are not binary weighted in a sub-radix-2 (i.e., radix less than 2) conversion architecture, so the conversion resolution does not equal to the number of conversion steps any more, providing redundancy that can be used to resolve ambiguity.

In an embodiment, capacitor value update unit 202 determines the capacitor value at any given tap according to the following equation:

$$Cap_k(n+1)=Cap_k(n)-\mu*error(n)\cdot[Code_{P_k}(n)-Code_{N_k}(n)], \quad (4)$$

where µ represents the step size. In conjunction with the calibration circuit 206, Equation 4 may be simplified as follows:

$$Cap_k(n+1)=Cap_k(n)-\mu_k(n)\cdot sign(error(n))\cdot[Code_{P_k}(n)-Code_{N_k}(n)]. \quad (5)$$

In Equation 5, the sign of error(n) represents the bit value (+1 or −1), and the difference (Code_P$_k$(n)−Code_N$_k$(n)) represents a value of 1, −1, or zero, so the multiplication of the step size times the error times the differential code is simplified into a multiplication by one or minus one, which can be implemented with simple adders as opposed to a more complex multiplier. Thus, the sign of the error is used to update the capacitor value by either adding or subtracting the step size corresponding to the capacitor position (k) as shown in FIG. 5 below.

While the above-discussion describes the overall operation of the SAR ADC 100, it is important to understand how the excitation signal 210 is used to excite SAR circuit 104. One possible example of a portion of the SAR circuit 104 is described below with respect to FIG. 3.

Figure 3:
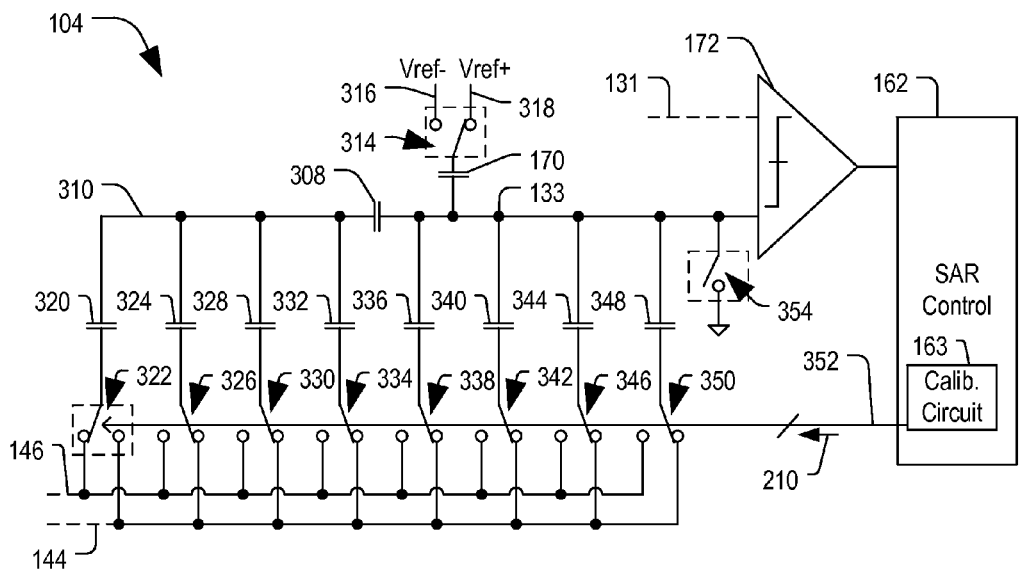
FIG. 3 is a diagram of a portion of the SAR comparator of the SAR circuit of FIG. 1 according to an embodiment.

FIG. 3 is a diagram of a portion of the SAR circuit 104 of FIG. 1 according to an embodiment. SAR circuit 104 includes a comparator 172 including an input coupled to node 133, a second input coupled to node 131, and differential outputs coupled to SAR control circuit 162, which in the embodiment shown includes calibration circuit 163.

SAR circuit 104 includes a capacitor 308 coupled between node 133 and 310. SAR circuit 104 further includes a capacitor 170 coupled between node 133 and a switch 314, which can selectively couple a second terminal of capacitor 170 to a first supply terminal 144 and a second supply terminal 146. SAR circuit 104 further includes a plurality of weighted capacitors 320, 324, 328, 332, 336, 340, 344, and 348, which are weighted according to the selected radix. In one possible example that uses a radix of 1.86, capacitor 320 may have a capacitance of 1 pf; capacitor 324 may have a capacitance of 1.86 pf; capacitor 328 may have a capacitance of 3.46 pf; and so on.

Capacitor 320 is coupled between node 310 and switch 322, which is configured to selectively couple capacitor 320 to one of the supply terminals 144 or 146. Capacitor 324 is coupled between node 310 and switch 326, which is configured to selectively couple capacitor 324 to one of the supply terminals 144 or 146. Capacitor 328 is coupled between node 310 and switch 330, which is configured to selectively couple capacitor 328 to one of the supply terminals 144 or 146. Capacitor 332 is coupled between node 310 and switch 334, which is configured to selectively couple capacitor 332 to one of the supply terminals 144 or 146.

Capacitor 336 is coupled between node 304 and switch 338, which is configured to selectively couple capacitor 336 to one of the supply terminals 144 or 146. Capacitor 340 is coupled between node 304 and switch 342, which is configured to selectively couple capacitor 340 to one of the supply terminals 144 or 146. Capacitor 344 is coupled between node 304 and switch 346, which is configured to selectively couple capacitor 344 to one of the supply terminals 144 or 146. Capacitor 348 is coupled between node 304 and switch 350, which is configured to selectively couple capacitor 348 to one of the supply terminals 144 or 146. SAR circuit 104 further includes a switch 354 configured to selectively couple node 133 to a supply terminal (such as ground).

SAR controller 162 includes calibration circuit 163, which has an output 352 configured to carry capacitor control signal 210 to control switches 322, 326, 330, 334, 338, 342, 346, and 350. Capacitor control signal 210 or some other control signal from calibration circuit 163 may also be provided to switch 314 to charge capacitor 170 and to switch 354. During calibration, signal generator 208 of calibration circuit 163 generates a code word (which may be provided as capacitor control signal 210) to control switches 322, 326, 330, 334, 338, 342, 346, and 350. The code word determines which of the switches are coupled to supply terminal 144 and which are coupled to supply terminal 146, thereby controlling the charges stored on capacitors 320, 324, 328, 332, 336, 340, 344, and 348 as well as the charge stored on capacitor 170. The charges are thus provided to the input of comparator 172 via node 133, and comparator 172 provides digital outputs to SAR control circuit 162. By selectively altering the switch configuration over time, a sinusoidal waveform may be presented to the inputs of comparator 172. By selectively coupling capacitors 168 and 170 to a selected voltage, pseudo random noise may also be provided to the inputs of comparator 172.

While only one side of the differential circuit is depicted, it should be appreciated that a corresponding structure is a coupled to node 131 (as generally shown in FIG. 1), providing differential calibration signals to comparator 172. The calibration circuit 163 is configured to determine the size of each capacitor 320, 324, 328, 332, 336, 340, 344, and 348 relative to the capacitor 170 and the sizes of corresponding capacitors coupled to node 131 relative to capacitor 168. The sizes are determined relative to the capacitors 168 and 170 and thus can be related to one another. The gain error may be calibrated separately. During calibration, the SAR ADC 100 performs the calibration process and is not used for other operations. Further, no external connections or instruments are used to provide the calibration signal, since the internal calibration can be injected using signal generator 208 plus the charges stored on capacitors 168 and 170.

In an example, capacitors, such as capacitors 168 and 170, are selected to have a small size, which avoids clipping and reduces circuit area. However, larger capacitors 168 and 170 may make it possible to toggle the most significant bits, achieve fast convergence speed, and reach selected weights values more quickly. To excite the most significant bit capacitors, the capacitors may be selected to be approximately 3% to 5% of 1000 divided by a total capacitance.

In a general LMS adaptation, the determination of the capacitor weights may be adjusted in each iteration. In the SAR ADC 100, the adaptation rate may be different for each tap, and the adaptation may be stopped when the code doesn't change for a particular tap over a number of iterations. In one embodiment, the capacitors 168 and 170 may be configured to be approximately 100 divided by the total capacitance, which results in a relative capacitance of approximately 0.35%. In this example, the most significant bit adaptation rate is approximately 0.39%, which is about 1 in 250 iterations. In another embodiment, the capacitance is 1000 divided by the total capacitance, which results in a relative capacitance of approximately 3.5% and a most significant bit adaptation rate of approximately 12% (one out of eight iterations).

A sign-based LMS can be used to reduce computation intensity (power) and implementation area, without sacrificing adaptation speed. If the sign-based LMS is applied, the difference between the capacitor weights of the next and current values ($W_k(n+1)-W_k(n)$) is equal to plus or minus the step size (µ), which is a fixed value. Thus, an "add" or "subtract" can be used in a place of high precision and high speed "multiplier" in the conversion.

As discussed above, the capacitor control signal 210 may be provided to the SAR circuit 104 to control switches to selectively couple the capacitors to a selected voltage and to dump the resulting charge onto the inputs. In one example, the input signal may be ramp signal. This makes it possible to use a purely digital code to select the capacitors and to initiate the calibration process. One possible example of a timing diagram illustrating the excitation signal implemented as a ramp signal with pseudo random noise is described below with respect to FIG. 4.

Figure 4:
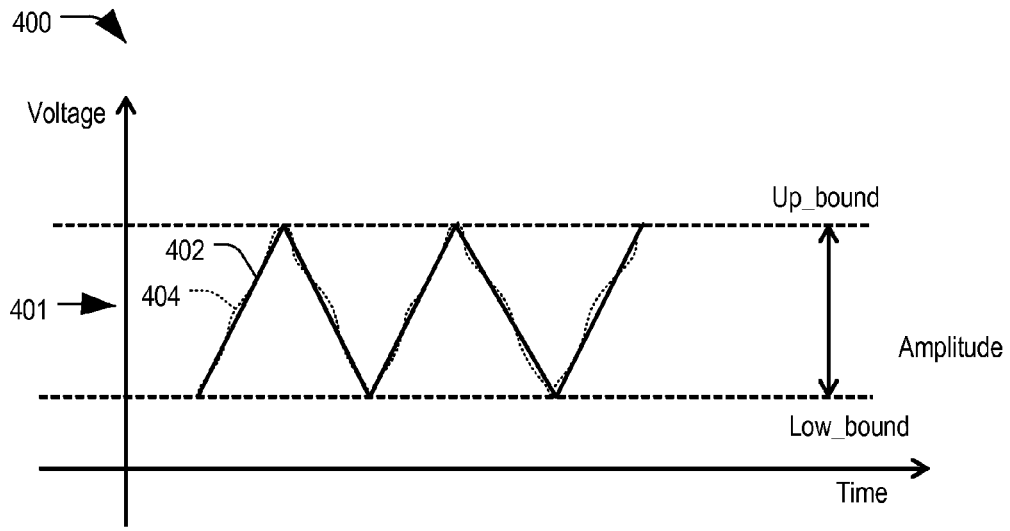
FIG. 4 is a timing diagram depicting a waveform for calibration of the SAR ADC of FIG. 1 according to an embodiment.

FIG. 4 is a timing diagram depicting a calibration waveform 401 resulting from a time-varying capacitor control signal 210 for calibration of the SAR ADC 100 of FIG. 1 according to an embodiment. Waveform 401 is generated by the charge dumped by the capacitors in response to the capacitor control signal 210 from signal generator 208. Waveform 401 includes a ramp signal 402 with pseudo random noise 404 (indicated by a dotted line). The periodic ramp waveform 402 at a given time (n) is provided according to the following equation:

$$\text{wave}_n = \text{wave}_{n-1} + \text{step}_{value} \qquad (6)$$

The step size can be determined by twice the amplitude divided by the ratio of the sampling frequency (fs) to the waveform frequency (fo), as follows:

$$\text{step}_{size} = \frac{2 \cdot \text{amplitude}}{\frac{f_s}{f_o}}. \qquad (7)$$

In the illustrated example, the waveform 401 increases to an upper bound, then decreases to a lower bound using step sizes determined by LMS step size control and step generator 206 and/or by the wave register 410. Input signal 424 can be used to calibrate SAR circuit 104. Signal generator 208 may be implemented in a variety of ways. One possible implementation is described below with respect to FIG. 5.

FIG. 5 is a block diagram of a signal generator 208 of the calibration circuit 163 of FIG. 1 configured to produce the capacitor control signal 210 to produce waveform 401 of FIG. 4. Signal generator 208 includes a comparator 502, which includes an input coupled to an output of a summing node 514 and an output to provide a sign of the error 205 to a multiplier node 506. Multiplier node 506 includes a second input coupled to a step size register 504 to receive a step size signal 207. Multiplier node 506 multiplies the step size signal 207 by the sign of the error 205 and provides the product to an input of summing node 508. Summing node 508 includes a second input coupled to a waveform register 510 to receive a code word, and is configured to add the code word to the step size product to produce a waveform that is provided to an input of a summing node 514 and to an input of a unit delay block 512. Unit delay block 502 provides a signal to wave register 510 to delay the code word.

Summing node 514 receives the waveform from summing node 508 and receives pseudo random noise from pseudo random noise generator 516 and adds them to produce excitation signal 210. Capacitor control signal 210 is provided to an input of comparator 502 and to an output that is coupled to switches of SAR circuit 104.

In the illustrated example, the only multiplication in the signal generator 208 involves the sign of the error 205 at multiplier node 506. However, such bit-wise multiplication either returns the step size signal 207 or an inverted version of the step size signal 207. Multiplier 506 can thus implement a simple bit-wise operation to determine the sign of the step.

In an embodiment, the wave register 510 is initialized to a low boundary value. The sign of the error 205 from comparator 502 is initialized to a plus one value. The step size register 504 is initialized to the following equation:

$$\text{step}_{size} = \text{floor}\left(\frac{0.7 \cdot 2^N}{\frac{f_s}{f_o}}\right), \qquad (8)$$

where fs is the sampling frequency and fo is the triangle waveform frequency. Pseudo random register 516 is configured to produce a pseudo random code to ensure that each bit has a fair chance to flip. The step size may be kept constant and incremented or decremented according to the sign of the error 205 from comparator 502.

In an example, wave register 510 provides a digital waveform to summing node 408. Comparator 502 provides a value of one or minus one depending on the results of the previous comparison. If the previous input to comparator 502 was less than a low boundary of the ramp signal, then the sign signal (labeled "sign_reg") is one, and otherwise, the sign signal is at minus 1 if the previous input was greater than the upper boundary. The sign signal changes at the boundaries and otherwise remains unchanging. In other words, the sign signal remains at 1 until the input exceeds the upper boundary, and then it changes to a minus one until the input falls below the lower boundary, at which time it changes back to a plus one value.

The step size generator register 504 provides a pre-determined number of most significant bits that can be used to vary the excitation signal 210 over time. In one possible example, the step size signal 207 can include a 5-bit code word that can be used to increment the input waveform to produce the capacitor control signal 210 as described below with respect to FIG. 6.

Figure 6:
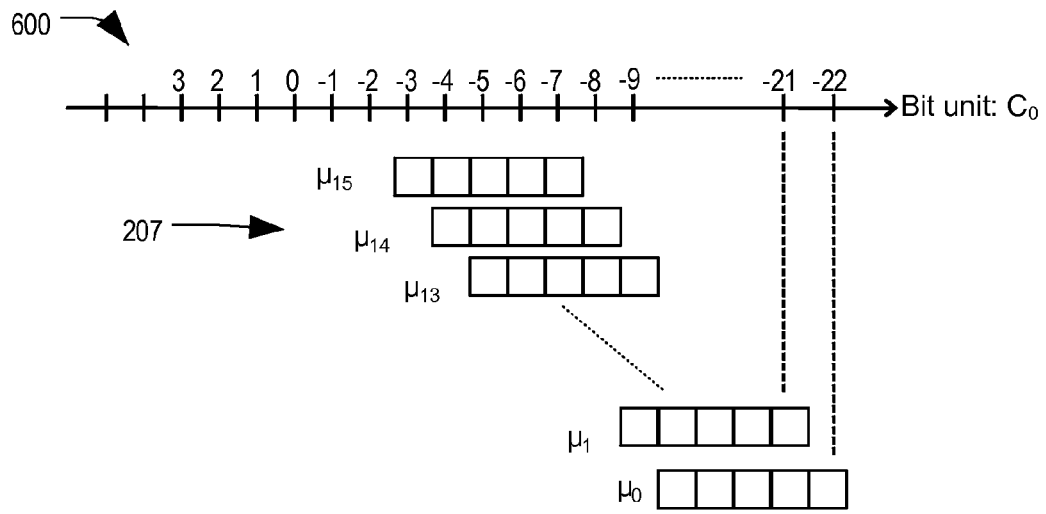
FIG. 6 is a diagram of the capacitive value format representing most significant 5-bits of the SAR in a 5-bit word according to an embodiment.

FIG. 6 is a diagram of the capacitive value format 600 representing most significant 5-bits (MSBs) of the SAR in a 5-bit word using the SAR circuit 104 of FIGS. 1-3. The MSB capacitor bits represent the step size signal 207, which is a code word represented with selected number of bits (i.e., 5-bits in the illustrated example). In an embodiment, the initial setting includes an initial step size ($\mu_0$), which may be equal to $17 \cdot \mu = 10001$, where the MSB is aligned to the −3 bit. At each interval, the MSB capacitor step size can be decremented by one to a smallest MSB step size of 1. During calibration, the step size may be incremented until an upper boundary is reached and may be decremented until a low boundary is reached. Thus, the waveform may be reproduced iteratively to calibrate the SAR ADC 100.

Figure 7:
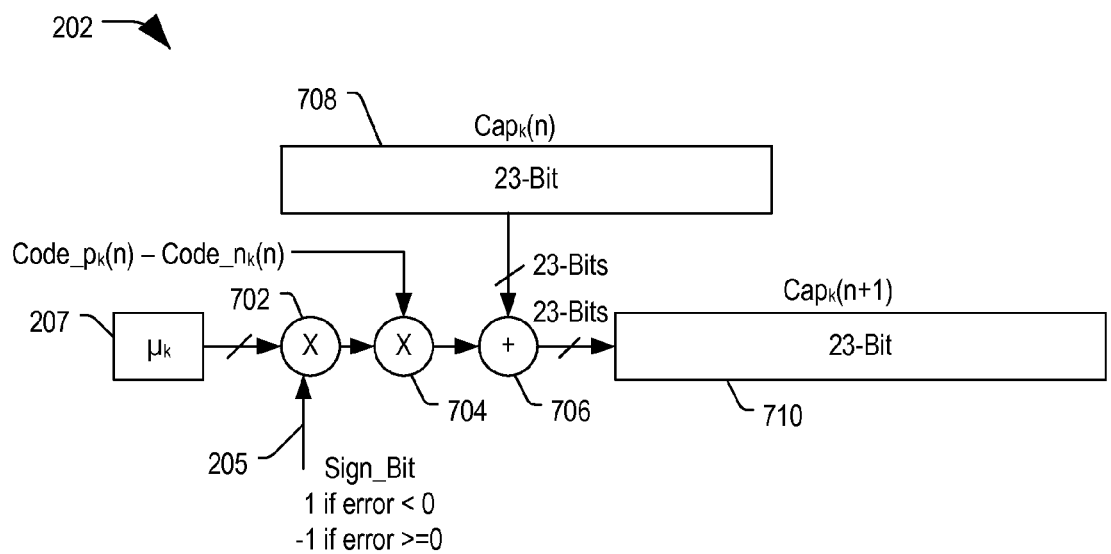
FIG. 7 is a block diagram of a capacitor value update unit of the calibration circuit of FIG. 2 according to an embodiment.

FIG. 7 is a block diagram of a capacitor value update unit 202 of the calibration circuit 163 of FIG. 2 according to an embodiment. Capacitor value update unit 202 includes a multiplier 702 to receive the step size signal 207 and to receive the sign bit signal 205. Multiplier 702 multiplies the step size signal 207 (represented by the 5-bits in FIG. 6) by the sign of sign bit signal 205 to produce a product that is provided to an input of a second multiplier 704. Multiplier 704 also receives a difference between the code words (Code_$P_k$(n)−Code_$N_k$(n)), which is either one, zero, or minus one. The difference is multiplied by the product using multiplier 704 to produce a second product that is added to the 23 bits of the current capacitor value (n) 708 to produce a sum 710 that represents the next capacitor value (n+1).

The capacitor value at a selected tap and at a selected point in time can be determined according to the following equation:

$$Cap_k(n+1)=Cap_k(n)-\mu(n)\cdot error(n)\cdot[Code_{P_k}(n)-Code_{N_k}(n)], \quad (9)$$

wherein the $Code_k$ represents a digital code corresponding to a particular tap (k), variable (n) represents the time, and the variable (u) represents the step size. In an embodiment, the error code may be simplified to utilize the sign of the error, rather than the error itself, as follows:

$$Cap_k(n+1)=Cap_k(n)-\mu_k(n)\cdot Sign(error(n))\cdot[Code_{P_k}(n)-Code_{N_k}(n)]. \quad (10)$$

Figure 8:
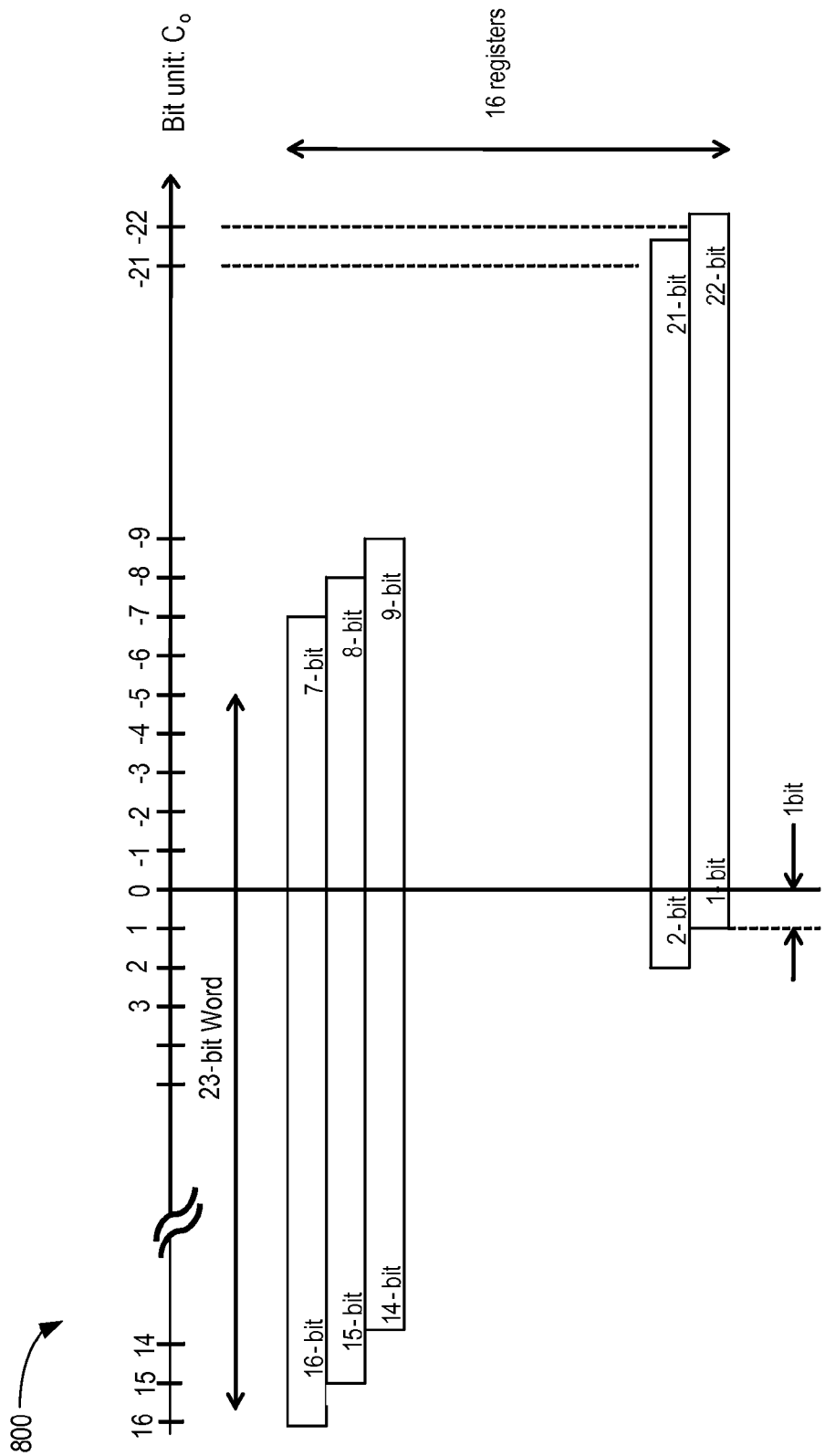
FIG. 8 is a diagram of the capacitive value format representing 16 bits in a 23-bit word using the SAR of FIGS. 1-3.

FIG. 8 is a diagram of the capacitive value format 800 representing 16 bits in a 23-bit word using the SAR circuit 104. In the illustrated example, for the LMS adaptive update, the capacitor values are represented in a high-precision word of 23-bits. Selected or default capacitor values may be used as an initial guess. In the first iteration, the MSB is aligned to the 16-th bit and the least significant bit (LSB) is aligned to the −7 bit. In each iteration, the 23-bit word shifts by one bit until, in the last iteration, the MSB is aligned to the $1^{st}$ bit and the LSB is aligned to the −22 bit.

Once the capacitor values are determined through multiple iterations, the values may be stored in a capacitor value table or register. The capacitor value updating is completed by adding or subtracting the step size corresponding to the capacitor position as described below with respect to FIG. 9.

Figure 9:
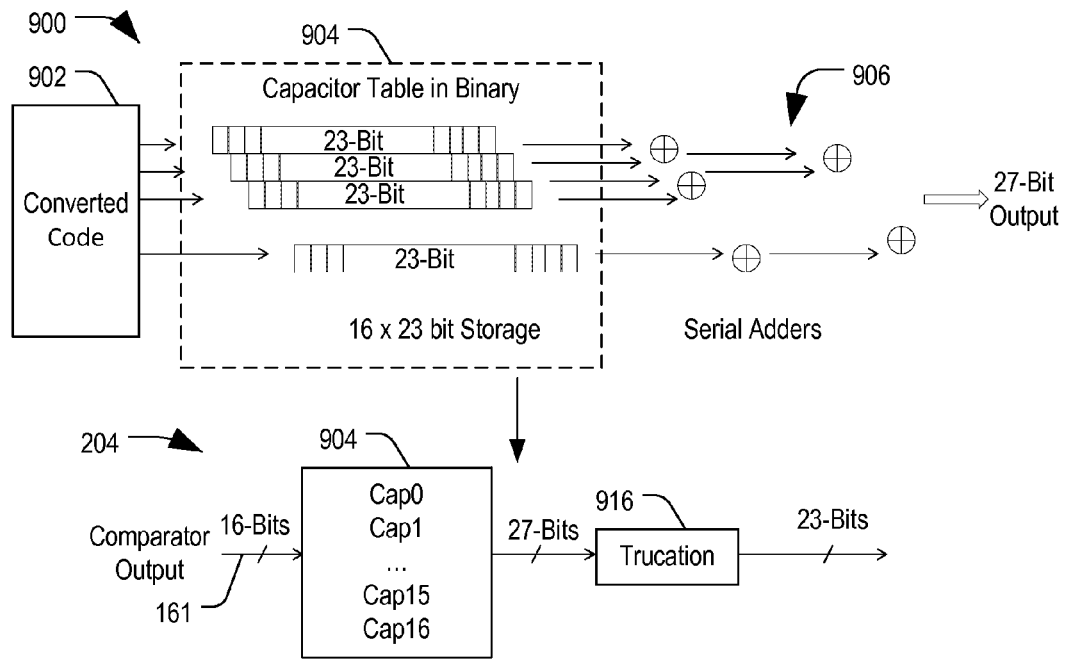
FIG. 9 is a block diagram illustrating one possible implementation of a portion of a code correction circuit for calibrating the SAR of FIGS. 1-3 according to an embodiment.

FIG. 9 is a block diagram illustrating one possible implementation of a code correction circuit 900 for calibrating the SAR of FIGS. 1-3 according to an embodiment. In an example, the code correction circuit 900 can represent at least a portion of calibration circuit 163 in FIG. 1. Code correction circuit 900 includes converted code 902 representing the digital outputs of comparator 172 in FIG. 1, which are stored in binary form in a capacitor table 904. In this example, capacitor table 904 is depicted as a 16×23 bit storage table. The binary values of capacitor table 904 may be processed by a serial adders to produce a 27-bit output. In particular, groups of four 23-bit words are added together serially, and the resulting carry increases the number of bits by four, producing the 27-bit output.

As shown, the 27-bit output can be truncated by a truncation operation to provide a 23-bit output representing a digital value corresponding to the input signal that can be used to determine the sign bit value. In a particular example, the four least significant bits are truncated, leaving the 23 MSBs. One possible example of a capacitor coefficient updating system that makes use of both positive and negative output codes from comparator 172, as discussed below with respect to FIG. 10.

Figure 10:
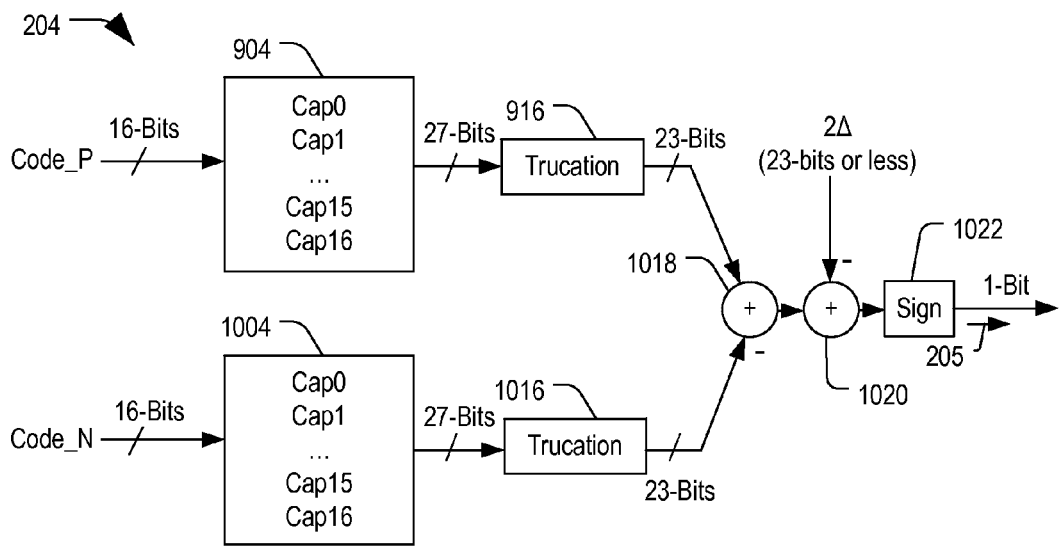
FIG. 10 is a block diagram illustrating a code correction engine for calibrating positive and negative output codes of the SAR of FIGS. 1-3 according to an embodiment.

FIG. 10 is a block diagram of an error correction unit 204 within the calibration circuit 163 configured to determine a sign of an error bit according to an embodiment. In the illustrated example, a digital approximations of the sampled value, which are provided as positive code (labeled "Code_P") and negative code (labeled "Code_N"), are input to capacitor tables 904 and 1004, respectively. The binary values of capacitor table 904 are truncated from 27-bits to 23-bits by truncation operation 916, and the resulting 23-bit word is provided to a first input of a summing node 1018. The binary values of capacitor table 1004 are truncated from 27-bits to 23-bits by truncation operation 1016, and the resulting 23-bit word is provided to a second input of summing node 1018. Summing node 1018 subtracts the value at the second input from the value at the first input and the difference is provided to an output of summing node 1018, which is coupled to a first input of summing node 1020.

Summing node 1020 includes a second input to receive a code word representing the value of the capacitors (2Δ), which may be 23-bits or less. Summing node 1020 subtracts the value at the second input from the value at the first input to produce a difference value that is provided to the output, which is coupled to an input of a sign block 1022. Sign block 1022 is configured to determine a sign bit based on the difference value and to generate a 1-bit output representing the sign of the difference. This 1-bit output may correspond to the sign of the error signal 205 from error computation unit 204 in FIG. 2.

In the illustrated example, the digital approximation inputs correspond to outputs of SAR circuit 104. The Code_P value represents the digital code corresponding to the input voltage ($V_{IN}$) plus the charge associated with the capacitor (+$Q_A$), e.g., capacitor 168. The Code_N value represents the digital code corresponding to the input voltage ($V_{IN}$) minus the charge associated with the capacitor (−$Q_A$), e.g., capacitor 170. Since the Code_P value and the Code_N value have only "1" and "0" as their matrix elements, the error at a given time (n) can be determined using "add" or "subtract" as shown in the following equation:

$$error(n) = \sum_{k=0}^{N-1}\left[Code_{P_k}(n)\cdot Cap_{adopt_k}(n) - Code_{N_k}(n)\cdot Cap_{adopt_k}(n)\right] - 2\cdot\Delta_d(n). \quad (10)$$

In Equation 10, the codes P and N have only 1 and 0 as their matrix elements, so Equation 10 can be evaluated in binary form using add or subtract only, without multiplying.

In an embodiment, the step size may be maintained as a constant. In another embodiment, the step size is varied. By changing the adaptation step size, the coefficients are forced to move out of local minima during the LMS adaptation process. In an embodiment, step sizes may vary pseudo randomly. In another embodiment, step sizes may be varied in response to detection of no change in the comparator output code within a number of iterations that exceeds a pre-determined threshold. In an example, the threshold may be selected to three iterations with no change in the comparator output code, which may cause the step size to be adjusted. Another threshold may be selected to cause the system to alter the step size after the selected number of iterations to avoid stalling at a local minima. In a particular embodiment, a 20-bit calibration counter is used to count a total number of adaptive iterations. A couple of event counters can be used to insert the events for local minima handling. An event may be detected when the event count bit matches a pre-determined threshold.

Figure 11:
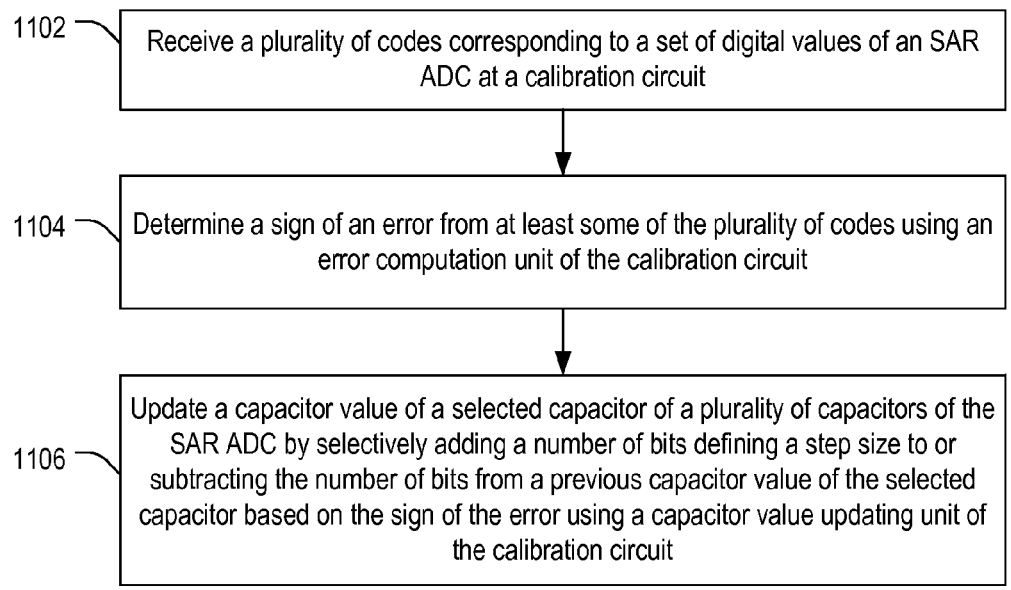
FIG. 11 is a flow diagram of a method of calibrating an SAR ADC using a sign-based least mean square (LMS) technique according to an embodiment.

FIG. 11 is a flow diagram of a method 1100 of calibrating an SAR ADC, such as SAR ADC 100 of FIG. 1, according to an embodiment. The method 1100 includes receiving a plurality of codes corresponding to a set of digital values of an analog-to-digital converter (ADC) at a calibration circuit, at 1102. Receiving the plurality of codes can include receiving plurality of positive codes from a first output of the ADC, receiving a plurality of negative codes from a second output of the ADC, and storing the pluralities of positive and negative codes in first and second registers, respectively, of the calibration circuit. The plurality of codes can be generated by a comparator of the SAR ADC based on a calibration signal that can be generated by a signal generator of the calibration circuit.

Advancing to 1104, a sign of an error from at least some of the plurality of codes is determined using an error computation unit of the calibration circuit. In an embodiment, determining the sign of the error includes adding at least some of the plurality of positive codes using a first plurality of serial adders to produce a first sum and adding at least some of the plurality of negative codes using a second plurality of serial adders to produce a second sum. Determining the sign of the error may further include subtracting the second sum from the first sum to produce a first difference, subtracting a delta capacitor value from the first difference to produce a second difference, and determining the sign of the error based on a sign of the second difference Proceeding to 1106, a capacitor value of a selected capacitor of a plurality of capacitors of the ADC is updated by selectively adding a number of bits defining a step size to or subtracting the number of bits from a previous capacitor value of the selected capacitor based on the sign of the error using a capacitor value updating unit of the calibration circuit.

In an embodiment, the step size is provided by a step size generator, which may selectively adjust the step size and provide the adjusted step size to the capacitor value updating unit to alter a least mean square convergence speed.

In conjunction with the circuits and methods described above with respect to FIGS. 1-11, a calibration circuit is configured to utilize a sign of an error to control a sign of a set of values defining a step size to add or subtract the set of values from a previous capacitor value for a selected capacitor. A difference between the positive and negative code words may also be used to adjust the sign of the step size and/or to zero the set of values, making it possible to update the capacitor values using addition instead of multiplication.

Although the present invention has been described with reference to preferred embodiments, workers skilled in the art will recognize that changes may be made in form and detail without departing from the scope of the invention.

What is claimed is:

1. A successive approximation register (SAR) analog-to-digital converter (ADC) comprising:
    an SAR comparator circuit including first and second inputs, a control input, and first and second outputs, the SAR comparator circuit including a plurality of capacitors coupled to the first and second inputs and including a plurality of switches configured to couple the plurality of capacitors to one of a first voltage and a second voltage; and
    a calibration circuit coupled to the first and second outputs and to the control input of the SAR comparator circuit, the calibration circuit including a signal generator to provide a control signal configured to control the plurality of switches to selectively couple the plurality of capacitors to one of the first and second voltages provide a calibration signal to the SAR comparator circuit, the calibration circuit configured to calibrate the SAR comparator circuit based on corresponding output signals at the first and second outputs, the calibration circuit further including an error computation unit coupled to the first and second outputs and configured to determine a sign of an error associated with the output signals.

2. The SAR ADC of claim 1, wherein the error computation unit is configured to determine a difference between data from the second output and data from the first output and to determine the sign of the error based on a sign of the difference.

3. The SAR ADC of claim 1, wherein the calibration circuit comprises:
    a step size generator configured to provide a step control signal; and
    a capacitor value update unit coupled to the step size generator and to the error computation unit, the capacitor value update unit configured to determine a capacitor value of a selected capacitor by selectively adding and subtracting the step control signal from output signals from the first and second outputs of the SAR comparator circuit.

4. The SAR ADC of claim 1, wherein the calibration circuit comprises the signal generator to generate a sequence of code words to control the plurality of switches to produce a periodic waveform at the first and second inputs.

5. The SAR ADC of claim 1, wherein the plurality of capacitors comprises:
    a first plurality of capacitors coupled to the first input;
    a second plurality of capacitors coupled to the second input; and
    where the plurality of switches selectively couple one or more of the first and second pluralities of capacitors to one of the first voltage and the second voltage; and
    a signal generator configure to control the plurality of switches to provide a sinusoidal calibration signal to the first and second inputs.

6. A calibration circuit comprising:
    at least one input coupled to at least one output of an analog-to-digital converter (ADC);
    at least one control output coupled to a control input of the ADC;
    a signal generator configured to provide a control signal to the at least one control output to control a plurality of switches to selectively couple a plurality of capacitors of the ADC to one of a first voltage and second voltage to produce a calibration signal; and
    a capacitor value update unit coupled to the at least one output of the ADC and configured to determine capacitor values of capacitors of the ADC in response to the calibration signal.

7. The calibration circuit of claim 6, further comprising:
    at least one offset capacitor coupled to the at least one input;
    at least one switch configured to selectively couple the at least one offset capacitor to a selected voltage; and
    wherein the signal generator is configured to control the at least one switch to inject noise onto the at least one input of the ADC.

8. The calibration circuit of claim 6, wherein the control signal is configured to selectively couple the plurality of capacitors of the ADC to one of the first and second voltages to produce a calibration signal on at least one input of the ADC during a calibration operation.

9. The calibration circuit of claim 6, further comprising an error computation unit coupled to the at least one output of the ADC and to the capacitor value update unit, the error computation unit configured to determine a sign of an error associated with an output signal from the at least one output of the ADC and to provide the sign of the error to the capacitor value update unit.

10. The calibration circuit of claim 6, wherein the signal generator comprises a comparator configured to produce a signal having a positive value when the calibration signal is less than a first threshold and having a negative value when the calibration signal is greater than a second threshold.

11. The calibration circuit of claim 10, wherein the signal generator further comprises:
   a multiplier configured to multiply a first plurality of bits defining a step size by a sign bit corresponding to a sign of an error associated with the output signal to produce a control signal step; and
   a first adder to add the control signal step to a second plurality of bits defining a switch configuration to produce the calibration signal.

12. The calibration circuit of claim 11, wherein the signal generator further comprises a second adder to add a third plurality of bits defining pseudo random noise to the calibration signal.

13. The calibration circuit of claim 6, wherein the calibration signal comprises a control signal configured to define a switch configuration of a plurality of switches of the ADC to selectively couple the plurality of switches to first and second voltages to produce the calibration signal including a sinusoidal waveform.

14. A method of calibrating an analog-to-digital converter (ADC), the method comprising:
   providing a calibration signal to inputs of the ADC by controlling a plurality of switches to selectively couple a plurality of capacitors to one of a first voltage and a second voltage, the plurality of capacitors coupled to the inputs of the ADC;
   determining a sign of an error of an output signal from the ADC; and
   updating a capacitor value of a selected capacitor of a plurality of capacitors of the ADC by selectively adding or subtracting a step size from a previous capacitor value of the selected capacitor based on the sign of the error.

15. The method of claim 14, wherein providing the calibration signal further comprises selectively coupling a first offset capacitor and a second offset capacitor to a selected voltage to inject pseudo random noise onto the inputs of the ADC.

16. The method of claim 15, wherein controlling the plurality of switches comprises selectively updating a configuration of the plurality of switches, iteratively, to produce the calibration signal having a periodic waveform at the inputs of the comparator.

17. The method of claim 14, wherein controlling the plurality of switches comprises periodically adjusting a switch control signal by one of an increment and a decrement according to a previous value of the switch control signal to generate the calibration signal.

18. The method of claim 17, wherein periodically adjusting the switch control signal comprises:
   incrementing the switch control signal by a pre-determined step size until the switch control signal exceeds a first threshold;
   decrementing the switch control signal by the pre-determined step size until the switch control signal is less than a second threshold; and
   repeating the incrementing and decrementing throughout a calibration operation to produce the calibration signal having a periodic waveform.

19. The method of claim 17, further comprising:
   selectively adjusting the pre-determined step size to produce an adjusted step size; and
   providing the switch control signal produced using the adjusted step size to a capacitor value update unit to alter a least mean square convergence speed.

* * * * *